Figure 1:
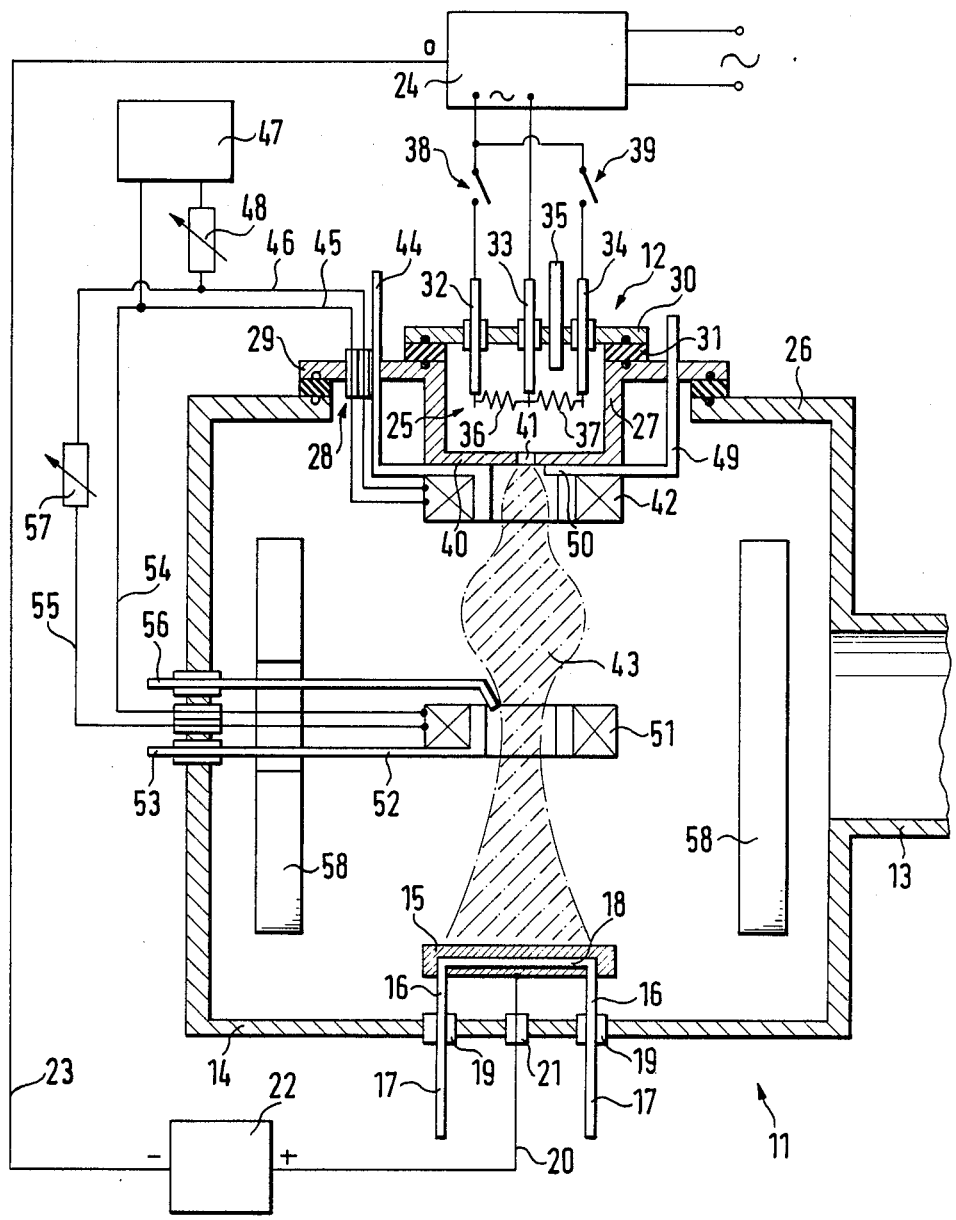

United States Patent [19]

dos Santos Pereiro Ribeiro

[11] Patent Number: 4,769,101
[45] Date of Patent: Sep. 6, 1988

[54] APPARATUS FOR SURFACE-TREATING WORKPIECES

[76] Inventor: Carlos A. dos Santos Pereiro Ribeiro, Von Stauffenbergstrasse 12, 7470 Albstadt 15, Fed. Rep. of Germany

[21] Appl. No.: 46,119

[22] Filed: May 5, 1987

[30] Foreign Application Priority Data

May 6, 1986 [DE] Fed. Rep. of Germany ....... 3615361

[51] Int. Cl.$^4$ .............................. B44C 1/22; B05B 5/02; B23K 9/00; C23C 15/00
[52] U.S. Cl. ..................... 156/345; 118/50.1; 118/623; 118/728; 156/643; 156/646; 204/298; 219/123; 219/121.55; 219/121.58
[58] Field of Search ............... 156/345, 643, 646; 427/38, 39; 118/728, 50.1, 620, 621, 623; 219/121 PD, 121 PU, 121 PE, 121, 121 PX, 121 PG, 122, 121 PR, 123, 121 PV, 121 PW; 204/192.11, 192.12, 192.32, 192.34, 298

[56] References Cited

U.S. PATENT DOCUMENTS 4,221,652  9/1980  Kuriyama ..................... 204/298
4,486,287  12/1984  Fournier ..................... 204/192 R

FOREIGN PATENT DOCUMENTS 2246983  4/1973  Fed. Rep. of Germany .
2823876  1/1979  Fed. Rep. of Germany .
2902142  8/1979  Fed. Rep. of Germany .
3221004  12/1982  Fed. Rep. of Germany .
2421957  11/1979  France .
 562327  5/1975  Switzerland .
2095029  9/1982  United Kingdom .

Primary Examiner—William A. Powell
Attorney, Agent, or Firm—Nies, Webner, Kurz & Bergert

[57] ABSTRACT

An apparatus for surface treatment, especially for etching and/or coating workpieces by ion bombardment is described. This apparatus comprises at least one ionization chamber having at least one hot cathode, gas atoms being introduced into this chamber for the low-voltage arc-discharge between the ionization chamber and at least one anode inside the treatment chamber connected to a vacuum pump. At least one magnet coil mounted within the treatment chamber is used to control the ion density of the low-voltage arc-discharge and is mounted inside the treament chamber. The workpieces to be treated are arranged outside these magnet coils. Homogeneous surface treatment of the workpieces is ensured by the selected arrangement of magnet coils and workpieces.

20 Claims, 5 Drawing Sheets

APPARATUS FOR SURFACE-TREATING WORKPIECES

The invention concerns an apparatus for surface-treating, in particular for etching and/or coating workpieces of the kind stated in the preamble of claim 1.

In known apparatus of this kind, the workpieces to be treated are arranged outside and around the arc-discharge plasma, and the ion density of this plasma is adjusted by a magnet coil mounted outside the treatment chamber coaxially with the low-voltage arc discharge. This arrangement of workpieces between the magnet coil and the arc discharge prevents forming a homogeneous magnetic field at the site of the arc discharge. As a result the plasma ion density is inhomogeneously distributed inside the arc discharge. Due to this inhomogeneous ion density distribution, homogeneous ion bombardment of the workpiece surfaces is impossible.

Another drawback of the above described arrangement of the workpieces around the arc-discharge axis and within the magnet coils is that this known treatment equipment for workpiece surfaces cannot be readily used as pass-through equipment for the continuous or discontinuous treatment of a large number of workpieces.

Accordingly it is the object of the invention to create apparatus of the initially cited kind for the surface-treatment of workpieces that shall make it possible at low energy cost to carry out uniform etching or coating of the workpieces even over a long period of time.

This problem is solved by applying the features stated in claim 1.

Accordingly the invention consists in mounting the magnetic coil(s) controlling the ion density in the low-voltage arc-discharge directly around this discharge zone whereas the workpieces to be treated are arranged in the treatment chamber outside the magnetic coils and at a distance from them. This arrangement of magnetic coils and workpieces results on one hand in the magnetic field of the coils being unhampered, that is being shadow-free from the workpieces in their control of the arc-dicharge ion-density, and on the other hand the ion-density control so achieved in the arc-discharge will assure uniform treatment of the workpiece surfaces. Because of the direct arrangement of the magnetic coils controlling the ion density in the plasma zones, these coils can be made substantially smaller than in the state of the art, whereby these coils will not adversely affect the ion flow from the plasma to the workpiece surfaces. Another advantage of the comparatively small magnet coils also arises in relation to the energy consumption because substantially less power is required to drive these magnet coils than for those of the state of the art which are of relatively large diameters and mounted outside the treatment chamber.

By arranging the workpieces in the immediate vicinity of the chamber walls, they will practically be advantageously outside the range of the magnetic fields generated by the magnet coils mounted between the incandescent, or hot cathode and its associated anode. On account of the workpieces being mounted parallel to the walls, or to the direction of discharge, the apparatus of the invention is suitable as pass-through equipment.

In an advantageous embodiment mode of the invention, at least two magnet coils are used, a first magnet coil being mounted at the exit side of the ionization chamber whereas the second magnet coil is mounted essentially centrally between the first magnet coil and the associated anode.

A particular apparatus of the invention of which the ionization chamber comprises at least two ion beam exits each with its own anode opposite the particular ion beam output is especially well suited for the simultaneous treatment of a plurality of workpieces arranged next to each other or to the treatment of an elongated workpiece.

In another advantageous embodiment of the invention, the ionization chamber is electrically insulated from the treatment chamber and consists of at least two parts, a first part containing the cooling means and the current feedthrough means for the hot cathode, the second part comprising the cooling means and the current feedthrough means for the magnet coil following the ionization chamber. The first magnet coils follows directly the ion beam output aperture, whereby the arc discharge is much constricted at this location and the gas ionization is activated correspondingly. This arrangement makes it possible to carry out the required constriction of the arc discharge by means of a comparatively low coil drive current.

The current in the arc discharge is 100 A and more, whereby both the anode(s) and the magnet coils mounted in vacuum-tight manner in the treatment chamber require suitable cooling. To the end, the magnet coils are cooled from a water-cooled ring at least on the winding inside. The anode(s) too are water-cooled, the cooling surface being provided on the anode back side away from the arc discharge.

The ion density of the discharge arc can be adjusted by changing the magnetic field intensity or be optimized for uniform ion extraction from the gas discharge. The magnetic field intensity can be varied either by changing the current through the magnet coils or by axially shifting the magnet coils relative to each other or to the discharge plasma. Advantageously current sources with high output impedances or resistances will be used for the magnet coils, so that inductive currents from the discharge arc into the windings will be suppressed. Preferably each magnet coil shall be fed from its own current source, however a single current source is provided where there are a plurality of anodes to be supplied.

Advantageously the workpieces arranged outside the range of the magnetic fields from the magnet coils and outside the discharge arcs may be hooked up to an adjustable auxiliary power supply to control the ion directions, this auxiliary power supply being either a high-frequency AC source, or a DC source at a negative potential relative to that of the anode.

If the apparatus of the invention is used as pass-through equipment, then the anode(s) may be designed to be water cooled ring anode(s) and the workpieces to be treated then are made to move below this ring anode in the projection of the ring aperture.

However, the advantageous use of the apparatus of the invention is not restricted to etching workpiece surfaces by means of bombardment of noble-gas ions, rather it is equally advantageous when employed for the so-called reactive etching of workpiece surfaces. In this method known per se, the noble-gas ions generated in the ionization chamber are mixed outside it with reactive gases to form a mixed ion beam. Suitable reactive gases illustratively are oxygen and nitrogen, also gases containing carbon dioxide, boron and/or fluorine.

The apparatus of the invention provides that the reactive gases or the mixture of reactive gases be introduced through supply lines issuing into the inside chamber of the magnet coils into the treatment chamber, the mouths of the supply lines being in the immediate vicinity of the ion beam. In an especially advantageous design of the apparatus of the invention and when using a beam of mixed ions, the ionization chamber is followed by a special chamber which advantageously will be located inside the first magnet coil. This chamber is equipped with an intake for the reactive gas. It is followed by another magnet coil. In this compound arrangement of ionization chamber and reactive-gas chamber, the gas pressure in latter is kept lower than in the ionization chamber and higher than in the treatment chamber. Where several ion beams are generated, a plurality of such ionization-chamber/reactive-gas-chamber units will be used.

When using these compound chambers, gas ionization takes place in two stages, a noble gas such as argon, helium or neon being continuously fed in the first stage into the ionization chamber where it is then ionized. The ions leaving the ionization chamber through the circular diaphragm toward the reactive gas chamber are concentrated by the first magnet coil and in the reactive gas chamber will mix with the gases, continuously supplied into this chamber, and that were previously ionized in a second ionization stage. Further constriction of the plasma takes place by means of the round diaphragm of the reactive gas chamber behind this round diaphragm, using a second magnet coil. To set the pressures within the chambers, the diameters of the round apertures are correspondingly selected and furthermore the partial pressures of the noble and reactive gases are correspondingly adjusted, taking into account too the suction power of the vacuum pump connected to the treatment chamber.

Advantageously the reactive gas chamber is mounted to but electrically insulated from the ionization chamber and the two chambers are kept at floating potential.

The advantages of the chamber following the ionization chamber are that the ionization chamber itself is free of reactive gases, whereby the hot cathode is not exposed to bombardment by reactive gas ions and hence shall have a longer life than in corresponding devices of the state of the art. Moreover the pressure of the noble gas in the ionization chamber can be lowered if there is a subsequent reactive gas chamber, whereby again the service life of the hot cathode is positively affected. Again, it is possible to substantially increase the proportion of ionized gas atoms by introducing the reactive gas directly into the zone of highest ion density of the discharge arc and of the highest magnetic field intensity. Also, the ratio of the partial pressures of noble gas to reactive gas can be freely selected in this manner, whereby the typical relationship between the discharge parameters such as ionization chamber pressure, arc current, anode voltage and magnetic field intensity on one hand and on the other the etching parameters such as the treatment chamber pressure, workpiece stressing and ion current toward the workpieces is almost entirely eliminated.

The advantageous applicabilities of the apparatus designed according to the invention are further supplemented by the possibility of coating workpieces in the gas phase while retaining the already described advantages.

In this manner illustratively the workpiece surfaces may be coated with boron nitrite or boron carbide by using gases containing boron and nitrogen or carbon dioxide. Again diamond-like coatings, the so-called I-C coatings, may be deposited on the workpieces if the reactive gas used is a hydrocarbon compound.

Additionally, the discharge-arc can be used as the ion source for sputtering atoms out of a solid-material cathode, the ion-bombarded cathode surface consisting of the material to be sputtered. The cathode is kept at a potential which is negative relative to the anode of the arc-discharge, and a high-frequency AC, or a voltage negative relative to the anode, is applied to the workpieces to be treated, making possible the deposition of ions and neutral particles on the workpiece surfaces.

Alternatively the discharge arc can be used as the electron source in the evaporation of solid materials, the materials themselves then being the anodes of the arc discharges. Again a high-frequency AC or a DC negative relative to the anode of the arc potential is applied to the workpieces being treated, making possible the deposition of the ions and of the neutral particles on the workpiece surfaces.

Using the apparatus of the invention, it is furthermore possible to deposit metal coatings, namely coatings of cathode material or evaporation products, on the workpiece surfaces, and these coatings will combine with other materials, illustrative reactive gases. As a result such coatings as nitrides, oxides, carbides or borides are obtained on the workpiece surfaces. Therefore metal coatings with occluded other materials can be made. These materials illustratively are obtained from the ionization in the reactive gas chamber or from the ring gap of the magnet coils.

In a further embodiment mode of the apparatus of the invention, the housings of the magnet coils electrically insulated from the treatment chamber also are kept at floating potential.

To increase the service life of the hot cathodes, the invention provides that the hot cathode be fed from an AC source and the anode from a DC source, the negative terminal of the DC source being connected to a center tap of the AC source, especially to the center tap of the secondary of a transformer of this AC source feeding the hot cathode.

To assure continuous operation with optimal electron emission, the hot cathode consists of three electrodes connected to each other by heater wires, the center electrode being permanently connected, and the two outer ones being alternatingly connectable by means of switches to the AC source. In operation, preferably one of the heater wires is connected through a pair of electrodes to the voltage source and the resistance of this heater wire is continuously monitored by a resistance measurement system which upon a predetermined resistance limit value of this heater wire being exceeded will switch the AC voltage source to the adjacent heater wire before the first one melts. As a result reliable operation of the apparatus of the invention is permanently assured.

To constrain a preferred direction of the particle motion relative to the ion beam when the workpieces are mounted on one side, accessory electrodes may be introduced into the treatment chamber to assume the function of electric screens. If these electrodes are cooled, they will not be excessively heated by being arranged near the discharge arc.

Figure 2:
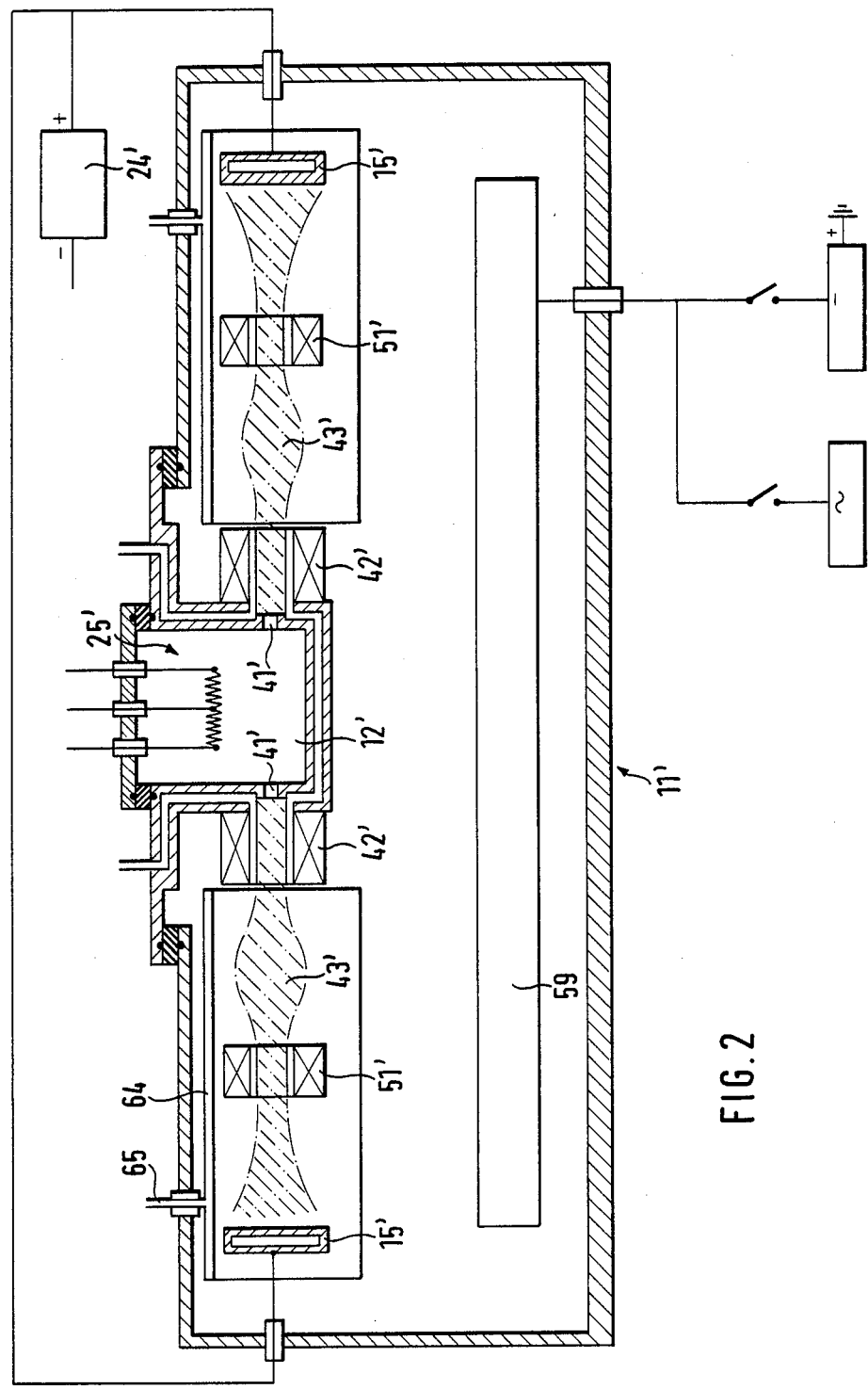
Figure 3:
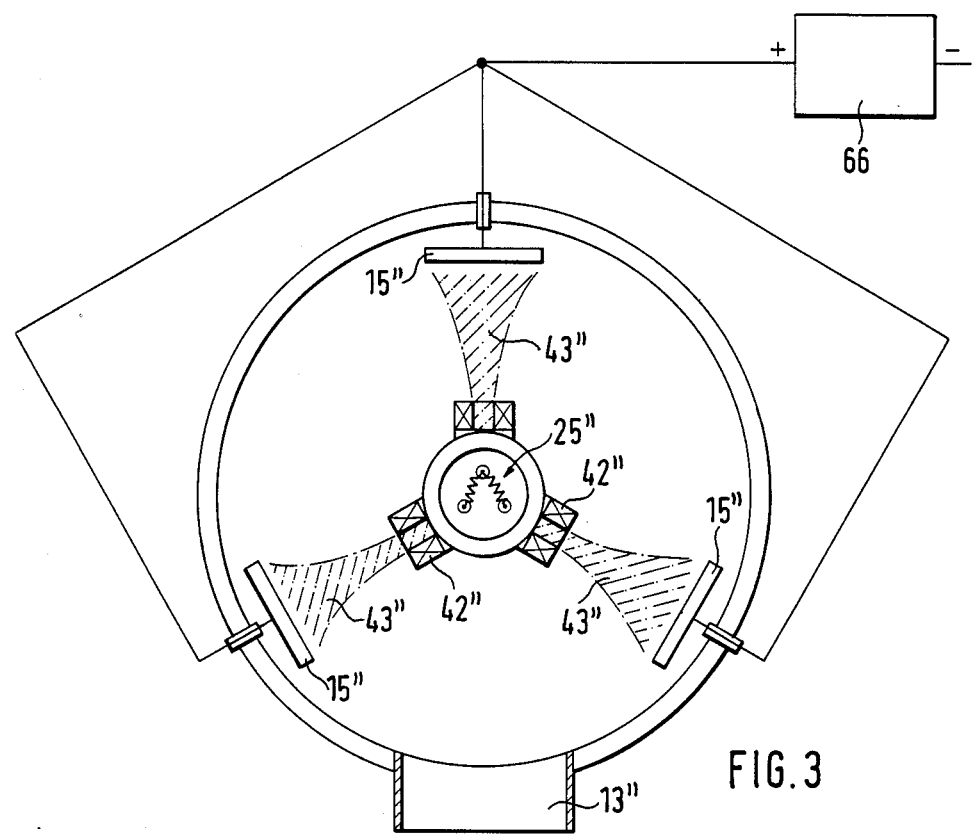
Figure 4:
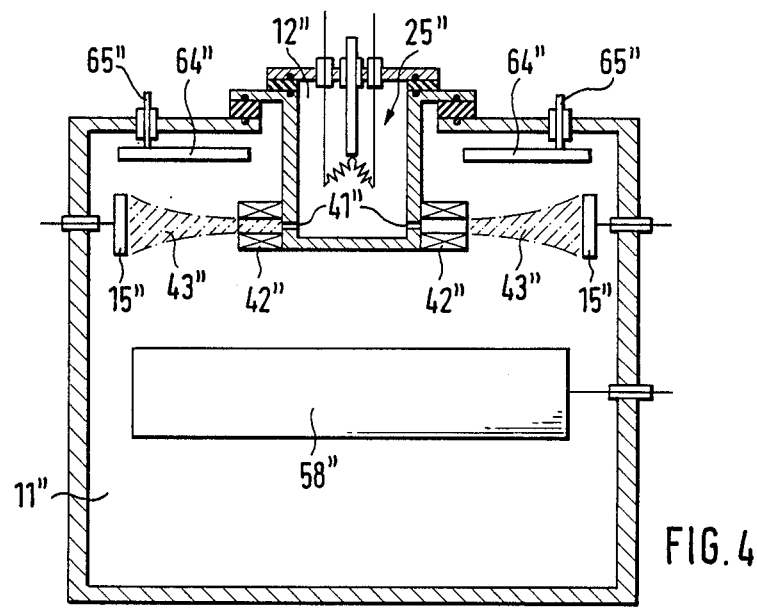
Figure 5:
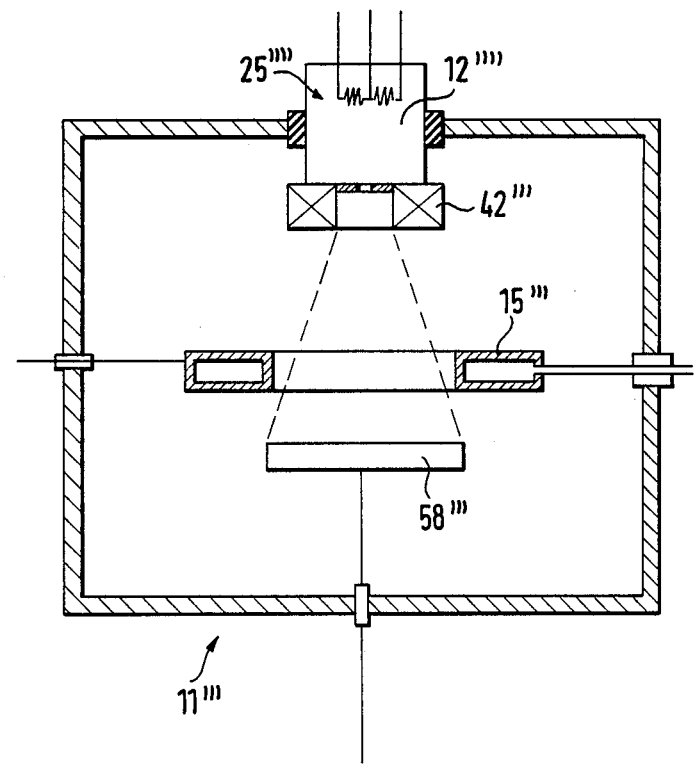
Figure 6:
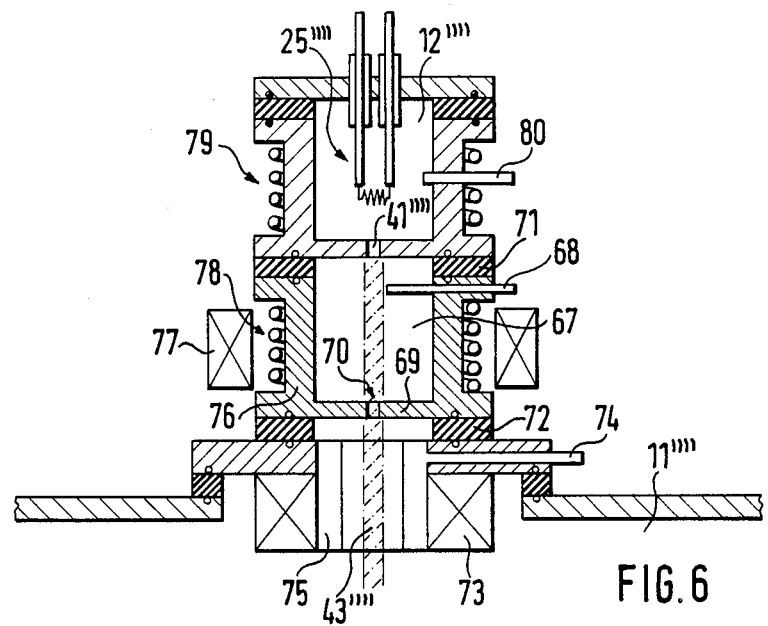
Figure 7:
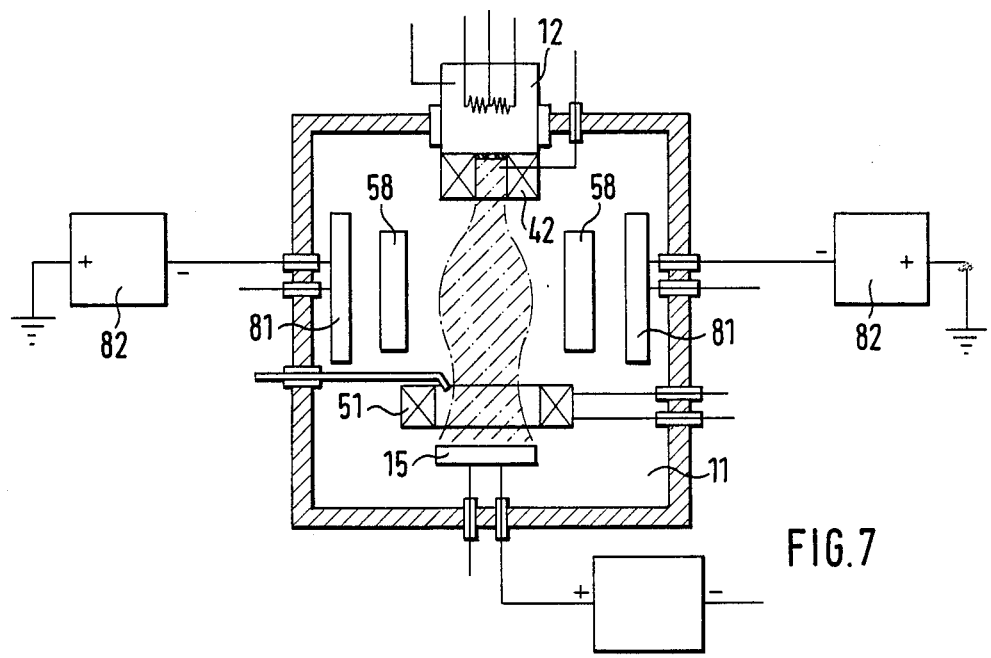

The object of the invention is shown in FIGS. 1 through 7 in relation to several preferred embodiments described in further detail below:

FIG. 1 is an axial section of the apparatus of the invention along the single discharge arc, FIG. 2 is a longitudinal section of an apparatus of the invention having two discharge arcs, FIG. 3 is a topview of an apparatus of the invention having three discharge arcs at its center, FIG. 4 is an axial section along lines IV—IV in FIG. 3, FIG. 5 is a section of an apparatus of a further embodiment mode, FIG. 6 is a section of an ionization chamber and of a reactive gas chamber of the apparatus of the invention, and FIG. 7 is a section of an apparatus for the combined etching and coating of workpieces for another embodiment mode.

The apparatus for the surface-treatment of workpieces shown in FIG. 1 comprises an elongated treatment chamber 11 and an ionization chamber 12, both having rectangular or cylindrical shapes. The treatment chamber 11 is vacuum-tight relative to the outside and comprises a hook-up stub 13 connected to a vacuum pump.

A plate-shaped anode 15 is mounted above the bottom 14 of the treatment chamber 11. The anode 15 is supported by the standpipes 16 of a cooling-fluid line 17 in the form of a cooling coil 18 within the anode 15. The cooling-fluid line 17 passes through sealing elements 19 into the bottom 14 of the treatment chamber 11. Again the electrical hook-up line 20 between the positive terminal of DC source 22 and the anode 15 passes through a vacuum-tight insulator 21. The negative terminal of the DC source 22 is connected by the line 23 to the center tap of an omitted transformer of an AC source 24. This AC source 24 provides the current to the hot cathode 25 in the ionization chamber 12 inserted into the cover 26 of the treatment chamber 11.

The ionization chamber 12 consists of a pot-shaped or tub-shaped housing 27 projecting through the aperture 28 in the cover 26 of the treatment chamber 11 into latter. The peripheral flange 29 of the housing 27 rests against the rim of the aperture 28 and is electrically insulated from same while being connected to it in vacuum tight manner.

The housing 27 of the ionization chamber 12 is closed by the cover 30 in vacuum-tight manner with insertion of an insulation 31. The three electrodes 32, 33 and 34 and also a noble-gas inlet stub 35 for the noble gas to be ionized in the ionization chamber pass in vacuum-tight manner through the cover 30. The heater wires 36 and 37 are mounted between the two outer electrodes 32 and 34 on one hand and the center electrode 33 on the other. The center electrode 33 is connected to one of the two AC terminals of the AC voltage source 24; the other AC terminal is connected through the two switches 38, 39 to the outer electrodes 32 or 34. The switches 38 and 39 are actuated by an omitted control or monitoring system continuously monitoring the ohmic resistance of the heater wire 36 carrying a current when the switch 38 is closed and which, when a critical upper value is reached, will open the switch 38 while simultaneously closing the switch 39, whereupon the current will pass through the second heater wire 37. As a result, the second and previously currentfree heater wire will be switched on every time before the first heater wire can be made to melt, that is, with adequate safety margin, and this second heater wire then takes over the electron-emission function. A central ion-beam exit aperture, or a circular diaphragm 41, is located in the bottom 40 of the housing 27 and connects the ionization chamber 12 to the treatment chamber 11. A first magnet coil 42 is mounted below the bottom 40 of the housing 27 and produces a magnetic chamber 12 toward the oppositely located anode 15. The first magnet coil 42 is cooled by a cooling system 44 through which flows a coolant. The first magnet coil 42 is connected by the electrical leads 45 and 46 to a first magnet-coil power supply 47. The connection leads 45 and 46 pass vacuum-tight through the housing flange 29 of the ionization chamber 12 and leave the treatment chamber 11. An adjusting resistor 48 is in series with the hook-up lead 46 to adjust the current setting up the magnetic field of the first magnet coil 42. A reactive gas can be fed through the pipe 49 of which the mouth 50 is located near the aperture 41 in the bottom 40 of the ionization chamber 12 into the treatment chamber.

To a further constrict the ion flow, or to control the ion density at the center of the discharge arc 43, a second magnet coil 51 is provided centrally between the first magnet coil 42 and the anode 15. This second magnet coil 51 also is cooled by a cooling system 52. The cooling-fluid lines 53, the electrical leads 54, 55 for the power to the second magnet coil 51 and the reactive-gas line 56 pass in vacuum-tight manner through a sidewall of the treatment chamber 11. The power is supplied to the second magnet coil 51 from the magnet-coil power source 47. An adjusting resistor 57 adjusting the current level is in series with one of the hook-leads, 55.

The etching apparatus shown in FIG. 1 preferably is designed as pass-through equipment. The workpieces 58 are arranged parallel to the two sidewalls of the treatment chamber and in their immediate vicinity and hence outside the magnetic fields of the first and second magnet coils 42 and 51 and can be moved through the treatment chamber by support means omitted from the drawing.

The design of the workpiece surface-treating apparatus shown in FIG. 2 is such that two low-voltage arc discharges can take place in it using only one ionization chamber 12' of which the design corresponds to the ionization chamber 12 of FIG. 1. Contrary to the latter however this chamber 12' comprises two ion beam exit apertures 41' located at opposite sites in the walls of the housing 27' of the ionization chamber 12'. A first magnet coil 42' and a second magnet coil 51' and an anode 15° are mounted axially behind said exits 15' and in a common plane, whereby discharge arcs 43' are formed on both sides of the ionization chamber 12' in the longitudinal direction of the treatment chamber 11'.

The apparatus of FIG. 2 is used to surface treat (etch or coat) large workpieces on one side and over the entire surface. In lieu of one workpiece 59 having a length corresponding almost to that of the treatment chamber 11', it is possible also to insert a plurality of smaller workpieces into the chamber 11°. The workpiece 59 can be connected to an auxiliary voltage source 60 or 61 located outside the treatment chamber 11'. The selective hook-up to either of the auxiliary voltage sources 60 and 61 is carried out by corresponding switches 62 and 63. The auxiliary voltage source 60 supplies high-frequency AC to the workpiece, whereas the auxiliary voltage source 61 applies a DC to the workpiece 59 which shall be negative relative to the anode potential. If all-side treatment is desired, a transport device with rotatable support must be provided.

Plate electrodes 64 are mounted between the discharge arcs 43' and the nearest wall of the treatment chamber 11° and are cooled by a cooling fluid introduced through electrically insulated hook-up lines 65 to the plates 64.

FIGS. 3 and 4 show an etching apparatus with a cylindrical treatment chamber 11" wherein three radially outward discharge arcs 43" are generated from a single central ionization chamber 12"', being mutually apart by 120°. Each discharge arc 43" is generated by means of a magnet coil 42" and an associated anode 15". The power supply for all three anodes 15" is from a common source 66.

As shown by FIG. 4, the workpieces 58" are arranged inside the cylindrical treatment chamber 11" below the discharge arcs 43 and between these latter and the bottom of the chamber.

FIG. 5 shows a further embodiment mode of the etching apparatus, comprising only a single magnet coil 42'" directly underneath the ionization chamber 12'". The cooled and annular anode 15'" is located approximately in the central plane of the treatment chamber. The workpiece 58'" is arranged in the space below the cooled ring anode 15'" and is electrically connected to an auxiliary voltage source. The ring anode 15'" is connected, just the way the anodes of FIGS. 1 through 4 are, to an omitted voltage source; the cooling fluid is supplied to it through a fluid line 17'".

As regards the embodiment of FIG. 6, a chamber 67 follows the ionization chamber 12'" and is supplied with a reactive gas through the line 68.

The reactive gas chamber 67 comprises an exit aperture 70 in its bottom 69 for the ion beam. The cylindrical chamber 67 is electrically insulated by the insulating rings 71 and 72 on one hand relative to the ionization chamber 12"" and on the other hand relative to the treatment chamber 11"". The magnet coil 73 is mounted below the chamber 67 and within the treatment chamber 11"" and is cooled by a cooling fluid fed through the line 74 into an annular cooling jacket 75 mounted on the inside of the magnet coil 42"".

The cylindrical casing 76 of the chamber 67 is enclosed by a magnet coil 77 assuming the function of the magnet coil 42 of FIG. 1. The casing 76 of the chamber 67 can be directly cooled using a cooling coil 78 crossed by a cooling fluid, where this coil rests against the outer surface, or it can be cooled by direct wall cooling, illustratively by means of a double wall.

Again, the housing 27"" of the ionization chamber 12""can be directly cooled using a cooling coil 79 resting against its outside, or by direct wall cooling, illustratively using a double wall. Further, a noble gas may be introduced into the ionization chamber 12"" through an intake line 80. The arc discharge extends from the ion beam exit 41"" in the bottom 40"" of the ionization chamber 12"" through the reactive gas chamber 67 and the aperture 70 in its bottom 69 into the treatment chamber 11"" as far as the omitted anode.

In the embodiment of FIG. 7, the ionization chambers 12ᵛ and the treatment chambers 11ᵛ essentially correspond to the parts of the treatment apparatus of FIG. 1. A sputtering cathode or a magnetron 81 is mounted each time between the workpieces 58ᵛ and the sidewalls of the treatment chamber 11ᵛ and are connected to the outer power sources 82. This apparatus also is suitable as pass-through equipment, namely for the combined surface treatment using ions from the discharge arc and using sputtered material from the sputtering cathodes 81.

We claim:

1. Surface-treating apparatus for treating the surface of workpieces by ion bombardment, comprising: at least one ionization chamber and a treatment chamber and means providing fluid flow communication between said two chambers; means enabling introduction of a gas into said ionization chamber; hot cathode means including at least one hot cathode mounted in said ionization chamber; at least one anode in said treatment chamber; means enabling electrical connection of said hot cathode means and said at least one anode to a low-voltage electrical source whereby the atoms of gas received in said ionization chamber enable a vehicle for a low-voltage arc-discharge between the hot cathode means in the ionization chamber and said at least one anode in the treatment chamber; and magnet coil means including at least one magnet coil (42, 42', 42", 42"', 51 etc.) to control the ion density in the low-voltage discharge between the hot cathode means and the said at least one anode; the improvement comprising that said at least one magnet coil is mounted inside said treatment chamber (11) and that the workpieces during treatment are disposed and arranged in said treatment chamber radially outside of said magnet coil means and of the path of said discharge arc.

2. Apparatus defined by claim 1, wherein said magnet coil means is an arrangement of a plural number of magnet coils (42, 51, 73) in the region of the arc discharge between the hot cathode means (25) and the said at least one anode (15) such that the axes of the magnet coils are aligned and substantially coincide with the center axis of the arc discharge.

3. Apparatus defined by claim 1 or 2, characterized in that the workpieces (58) are arranged near the wall(s) of the treatment chamber (11).

4. Apparatus defined by claim 1 or 2, wherein said ionization chamber (12) includes a housing (27) adjoining said treatment chamber and said fluid flow communication means comprises at least one ion beam aperture (41) in the ionization chamber housing; a first said magnet coil (42) is mounted directly adjacent said ion beam exit aperture (41) and outside of the housing (27) of the ionization chamber (12), as seen in the direction toward the anode (15), and at least a second said magnet coil (51) is mounted between the first magnet coil (42) and the anode (15).

5. Apparatus defined in claim 4, characterized by at least two anodes spaced apart in said treatment chamber and an ionization chamber (12', 12") comprising at least two ion beam exit apertures (41', 41") each axially opposite an anode (15', 15").

6. Apparatus defined by claim 1, characterized in that said at least one magnetic coil (42, 51, 73) is mounted in an axially displaceable manner.

7. Apparatus defined in claim 1, characterized in that the current sources (47) for the magnetic coils (42, 51, 73) include high output impedances and that their current levels can be regulated.

8. Apparatus defined by claim 1, characterized by means enabling connecting an adjustable auxiliary voltage to the workpieces (58) to be treated.

9. Apparatus defined in claim 8, characterized in that the auxiliary voltage is a high-frequency AC.

10. Apparatus defined in claim 8, characterized in that the auxiliary voltage is a DC negative relative to the anode potential 11. Apparatus defined in claim 1, characterized in that the anode (15) is a water-cooled ring anode (15''') and in that the workpieces (58''') are arranged behind the ring anode (15''') as seen in the direction of motion of the ion ion beam (42''').

12. Apparatus defined by claim 4 and comprising a system to introduce a reactive gas or a mixture of reactive gases into the treatment chamber (11), characterized in that the supply lines (49, 56) for the reactive gas issue into the inside space of the magnet coils (42, 51).

13. Apparatus defined by claim 12, characterized in that the reactive gas supply line (49) leading into the first magnet coil (42) issues in the immediate vicinity of the ion beam exit aperture (41) of the ionization chamber (12).

14. Apparatus as defined in claim 4, characterized by a reactive gas chamber (67) having a reactive-gas intake line and being subsequent to the ionization chamber (12) while being enclosed by a first magnet coil (77), and with a second magnet coil in the vicinity of the mixed-ion beam exit-aperture (70), the gas pressure in the reactive gas chamber (67) being maintained lower than in the ionization chamber (12) and higher than in the treatment chamber (11).

15. Apparatus defined by claim 1, characterized by an AC supply means (24) for the hot cathode means (25) and by a DC supply means (22) for said at least one anode (15), the negative terminal of the DC supply means (22) being connected to a voltage center tap of the AC supply means (24) for the hot cathode means (25), foremost to the secondary's center tap of a transformer of this means.

16. Apparatus defined in claim 15, characterized in that the hot cathode means (25) comprises three electrodes (32, 33, 34) connected together by by heater wires (36, 37), the center electrode being permanently connected and the two outer electrodes (32, 34) being alternately connected through switches (38, 39) to the AC supply means (24).

17. Apparatus defined in claim 16, characterized by a measuring and control system driving the two connecting switches (38, 39) in relation to the ohmic resistance of the heater wires (36, 37) and which upon a predetermined resistance limit being exceeded in the current-conducting heater wire will open the connecting switch of the associated outer electrode and will close the connecting switch of the other outer electrode.

18. Apparatus defined in claim 1 or 2, characterized in that said magnet coils (42, 51, 73) are electrically insulated relative to the treatment chamber (11) and means are provided to water cool said magnet coils.

19. Apparatus defined by claim 1, characterized in that the radial gap between the axis of the arc discharge and the surfaces of the work-pieces (58) facing the arc discharge is between 100 mm and 400 mm.

20. Apparatus defined by claim 19, wherein said radial gap between the axis of arc discharge and the surfaces of the work-pieces (58) facing the arc discharge is between 150 mm and 300 mm.

* * * * *